(12) United States Patent
Kasztenny et al.

(10) Patent No.: US 9,509,399 B2
(45) Date of Patent: Nov. 29, 2016

(54) TRANSMISSION LINE PROTECTION USING TRAVELING WAVES IN OPTICAL GROUND WIRE FIBER

(71) Applicant: Schweitzer Engineering Laboratories, Inc., Pullman, WA (US)

(72) Inventors: Bogdan Z. Kasztenny, Markham (CA); Douglas I. Taylor, Spokane, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 15/041,578

(22) Filed: Feb. 11, 2016

(65) Prior Publication Data

US 2016/0241336 A1 Aug. 18, 2016

Related U.S. Application Data

(60) Provisional application No. 62/116,116, filed on Feb. 13, 2015.

(51) Int. Cl.
*H04B 10/079* (2013.01)

(52) U.S. Cl.
CPC ................. *H04B 10/0791* (2013.01)

(58) Field of Classification Search
CPC . H02H 1/0061; H02H 3/003; H04H 10/0791
USPC .......................................... 361/62
See application file for complete search history.

(56) References Cited

U.S. PATENT DOCUMENTS 3,585,298 A 6/1971 Liberman
3,670,240 A 6/1972 Maranchak
3,878,460 A 4/1975 Nimmersjö
3,890,544 A 6/1975 Chamia
3,956,671 A 5/1976 Nimmersjö
(Continued)

FOREIGN PATENT DOCUMENTS

CN 104111404 10/2014
EP 226210 12/1986
(Continued)

OTHER PUBLICATIONS

PCT/US2016/17802 Patent Cooperation Treaty, International Search Report and Written Opinion of the International Searching Authority, May 6, 2016.

(Continued)

*Primary Examiner* — Stephen W Jackson
*Assistant Examiner* — Christopher Clark
(74) *Attorney, Agent, or Firm* — Jared L. Cherry; Richard M. Edge

(57) ABSTRACT

Disclosed herein are systems for detecting a location of a fault on an electric power transmission line using a state-of-polarization traveling wave in an optical ground wire Various embodiments may also detect a traveling wave on a conductor of the transmission system. The arrival times of the state-of-polarization traveling wave and the electrical traveling wave may be compared. Using the difference in times and the known propagation velocities of the traveling waves, a distance to the fault may be calculated. Arrival time of the state-of-polarization traveling wave may be calculated using electrical signals from photodetectors in an optical channel with polarizing filters at different orientations or reference frames.

20 Claims, 10 Drawing Sheets

(56) References Cited

U.S. PATENT DOCUMENTS

| | | | |
|---|---|---|---|
| 4,053,816 | A | 10/1977 | Nimmersjö |
| 4,254,444 | A | 3/1981 | Eriksson |
| 4,296,452 | A | 10/1981 | Eriksson |
| 4,351,011 | A | 9/1982 | Liberman |
| 4,377,834 | A | 3/1983 | Eriksson |
| 4,766,549 | A | 8/1988 | Schweitzer |
| 4,797,805 | A | 1/1989 | Nimmersjö |
| 4,800,509 | A | 1/1989 | Nimmersjö |
| 5,572,138 | A | 11/1996 | Nimmersjö |
| 5,682,100 | A | 10/1997 | Rossi |
| 5,729,144 | A | 3/1998 | Cummins |
| 6,477,475 | B1 | 11/2002 | Takaoka |
| 7,174,261 | B2 | 2/2007 | Gunn |
| 7,535,233 | B2 | 5/2009 | Kojovic |
| 7,733,094 | B2 | 6/2010 | Bright |
| 8,655,609 | B2 | 2/2014 | Schweitzer |
| 2001/0012984 | A1 | 8/2001 | Adamiak |
| 2002/0165462 | A1 | 11/2002 | Westbrook |
| 2006/0012374 | A1 | 1/2006 | Kojovic |
| 2008/0077336 | A1 | 3/2008 | Fernandes |
| 2009/0230974 | A1 | 9/2009 | Kojovic |
| 2013/0033267 | A1 | 2/2013 | Harlev |
| 2013/0096854 | A1 | 4/2013 | Schweitzer, III et al. |
| 2014/0074414 | A1 | 3/2014 | Schweitzer |

FOREIGN PATENT DOCUMENTS

| | | |
|---|---|---|
| EP | 241832 | 7/1990 |
| EP | 164711 | 12/1991 |
| EP | 244649 | 4/1992 |
| GB | 1463755 | 2/1977 |
| JP | H10177055 | 6/1998 |
| WO | 9519060 | 7/1995 |
| WO | 2010099585 | 9/2010 |

OTHER PUBLICATIONS

Harshad Mehta, Fault Location Techniques for High-Voltage DC Lines, EPRI EL-4331 Project 2150-1, Dec. 1985.

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, Dec. 1985.

Masaoki Ando, Fault Location Techniques for HVDC Lines: Analysis, Development, Simulation, and Field-Data Evaluation, 1984.

P.F. Gale, Overhead Line Fault Location Based on Travelling Waves & GPS, 1993.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, Feb. 1997.

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

PCT/US2012/060089 Patent Cooperation Treaty, International Search Report and Written Opinion of the International Searching Authority, Feb. 5, 2013.

Elhaffer, Power Transmission Line Fault Location Based on Current Traveling Waves. TKK Dissertations 107, Espoo 2008, Helsinki University of Technology. Department of Electrical Engineering, Dec. 2008.

PCT/US2015/050504 Patent Cooperation Treaty, International Search Report and Written Opinion of the International Searching Authority, Jan. 29, 2016.

Reason International, Inc., Traveling Wave Fault Location in Power Transmission Systems, White Paper.

Carlos Alberto Dutra, et al., "Fault Location by Traveling Waves: Application in High Impedance Events".

Toshio Tahagi, et al. "Fault Protection Based on Travelling Wave Theory—Part I Theory", Jan. 24, 1977.

Edmund O. Schweitzer III, et al, Locating Faults by the Traveling Waves They Launch, Feb. 10, 2014.

Normann Fischer, et al. "Protective Relay Traveling Wave Fault Location", Feb. 9, 2012.

Gabriel Benmouyal, et. Al. "Experience With Subcycle Operating Time Distance Elements in Transmission Line Digital Relays", Presented at the 37th Annual Western Protective Relay Conference Oct. 2010.

Edmund O. Schweitzer III, et. Al, "Speed of Line Protection—Can We Break Free of Phasor Limitations?", Schweitzer Engineering Laboratories, Sep. 16, 2014.

Zhaoyu Qin, et al. "New Method for Lighting Location Using Optical Ground Wire", Chinese Optics Letters, vol. 4, No. 12, Dec. 10, 2006.

Jesse Leeson, et al. "Polarization Dynamics in Optical Ground Wire Network", Applied Optics, vol. 48, No. 12, Apr. 20, 2009.

Joachim Wuttke, et al. "Polarization Oscillations in Aerial Fiber Caused by Wind and Power-Line Current", IEEE Photonics Technology Letters, vol. 15, No. 6, Jun. 2003.

Masahiro Kurono, et al. "Field Measurement and a Study of Transient State of Polarization in OPGW by Lightning", T.IEE Japan, vol. 118-C, No. 5, pp. 656-662, 1998.

Kiyoyuki Isawa, et al. "A New Powerline Fault Location System Detecting a Transient Polarization State", T.IEE Japan, vol. 115-C, No. 10, 1995.

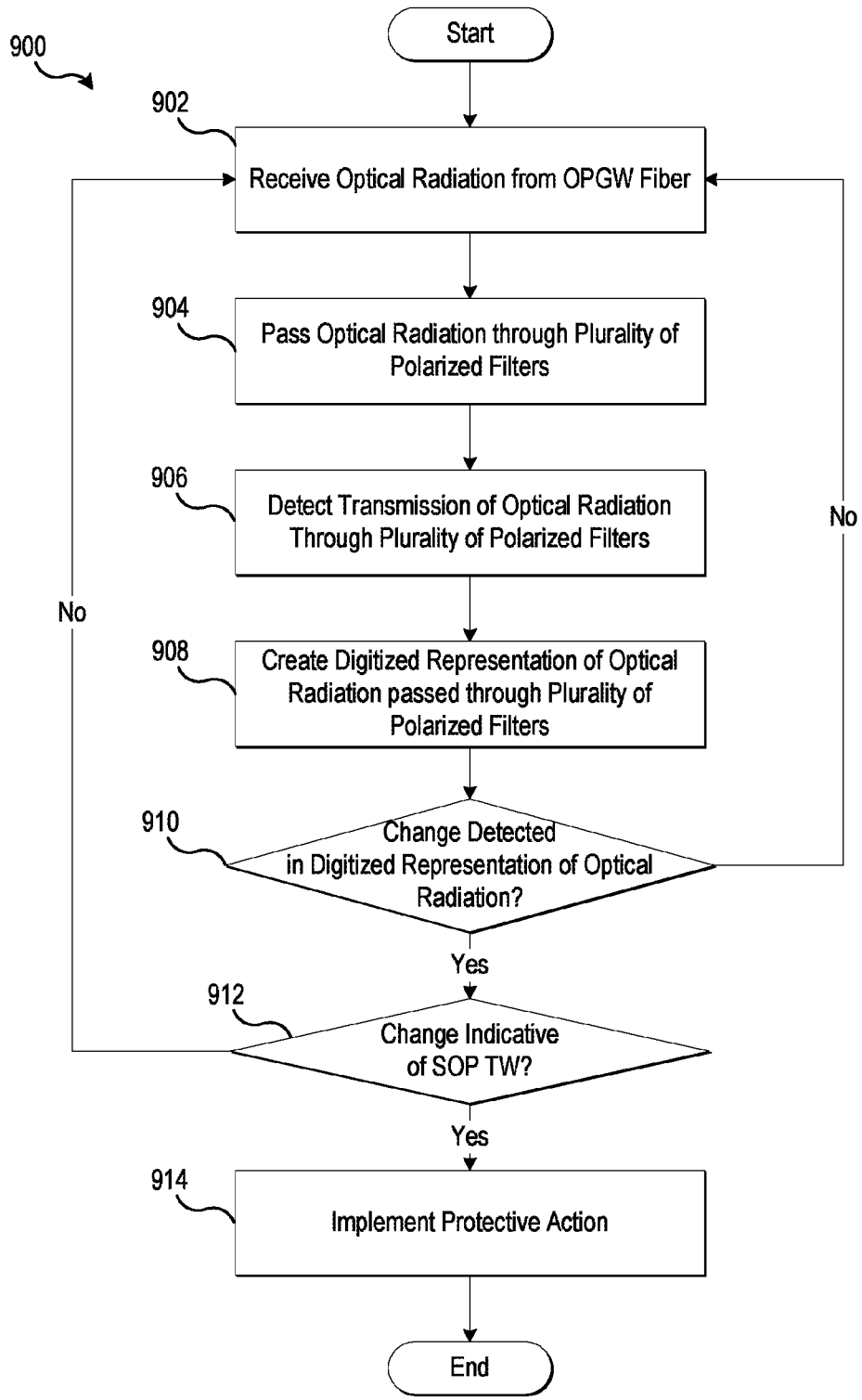

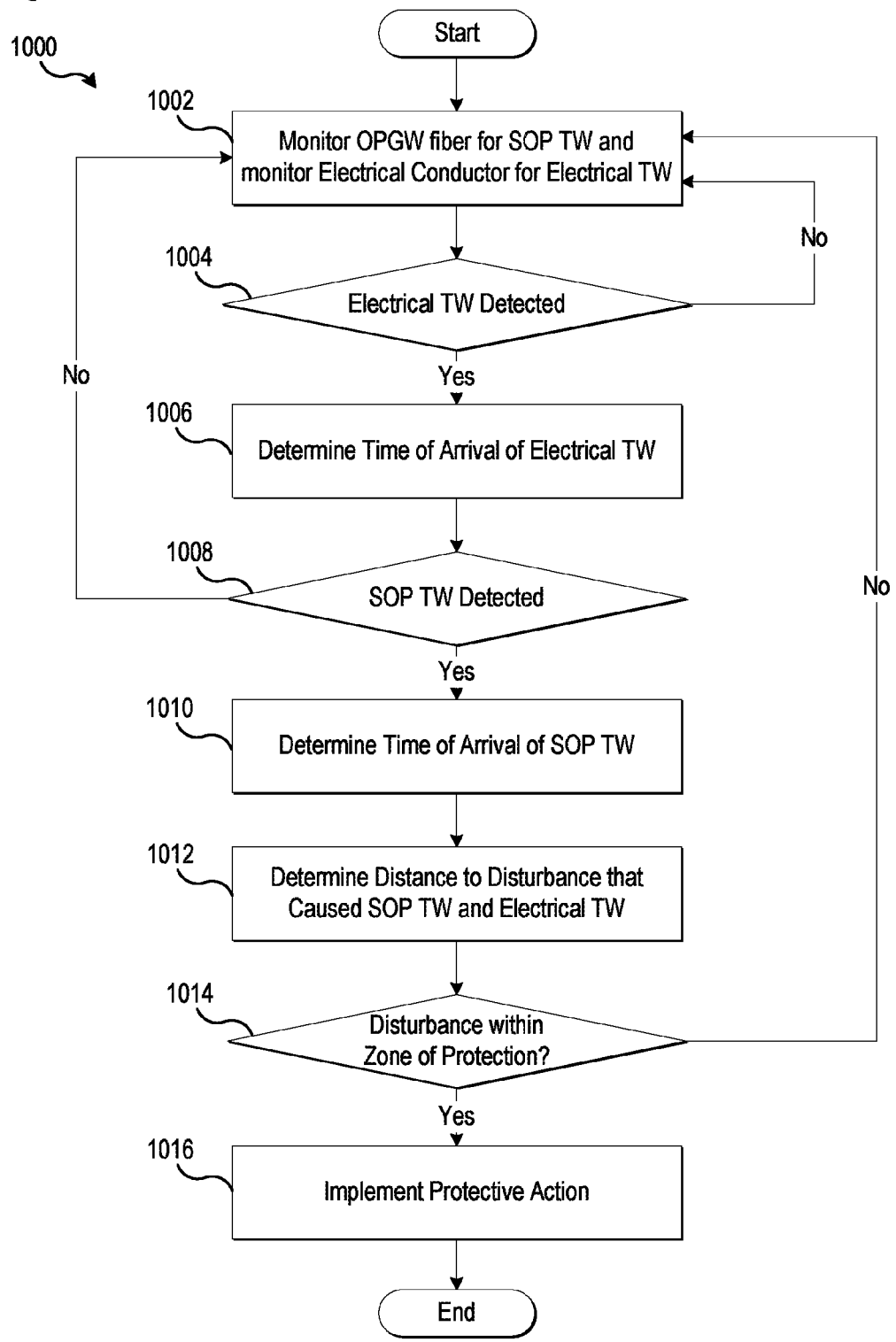

TRANSMISSION LINE PROTECTION USING TRAVELING WAVES IN OPTICAL GROUND WIRE FIBER

RELATED APPLICATION

The present application claims priority under 35 U.S.C. §119(e) to U.S. Provisional Patent Application No. 62/116,116, filed Feb. 13, 2015, and titled "TRANSMISSION LINE PROTECTION USING TRAVELING WAVES IN OPTICAL GROUND WIRE FIBER," which is incorporated herein by reference in its entirety.

TECHNICAL FIELD

This disclosure relates to transmission line protection using traveling waves in optical ground wire fiber ("OPGW"). More particularly, this disclosure relates, but is not limited to, detecting traveling waves in OPGW associated with electrical transmission lines using polarization of light in the OPGW and comparing the time of arrival of such traveling wave with a time of arrival of a traveling wave in the electrical transmission line to determine the occurrence of a disturbance and/or location of a disturbance.

BRIEF DESCRIPTION OF THE DRAWINGS

Non-limiting and non-exhaustive embodiments of the disclosure are described, including various embodiments of the disclosure with reference to the figures, in which:

FIG. 9 illustrates a flow chart of a method for detecting a disturbance in an electrical power system based on the detection of a SOP traveling wave and implementing a protective action consistent with embodiments of the present disclosure.

FIG. 10 illustrates a flow chart of a method for detecting a disturbance in an electrical power system based on the detection of a SOP traveling wave and an electrical TW, determining the distance to the disturbance, and selectively implementing a protective action if the disturbance is within a zone of protection consistent with embodiments of the present disclosure.

DETAILED DESCRIPTION

Figure 1A:
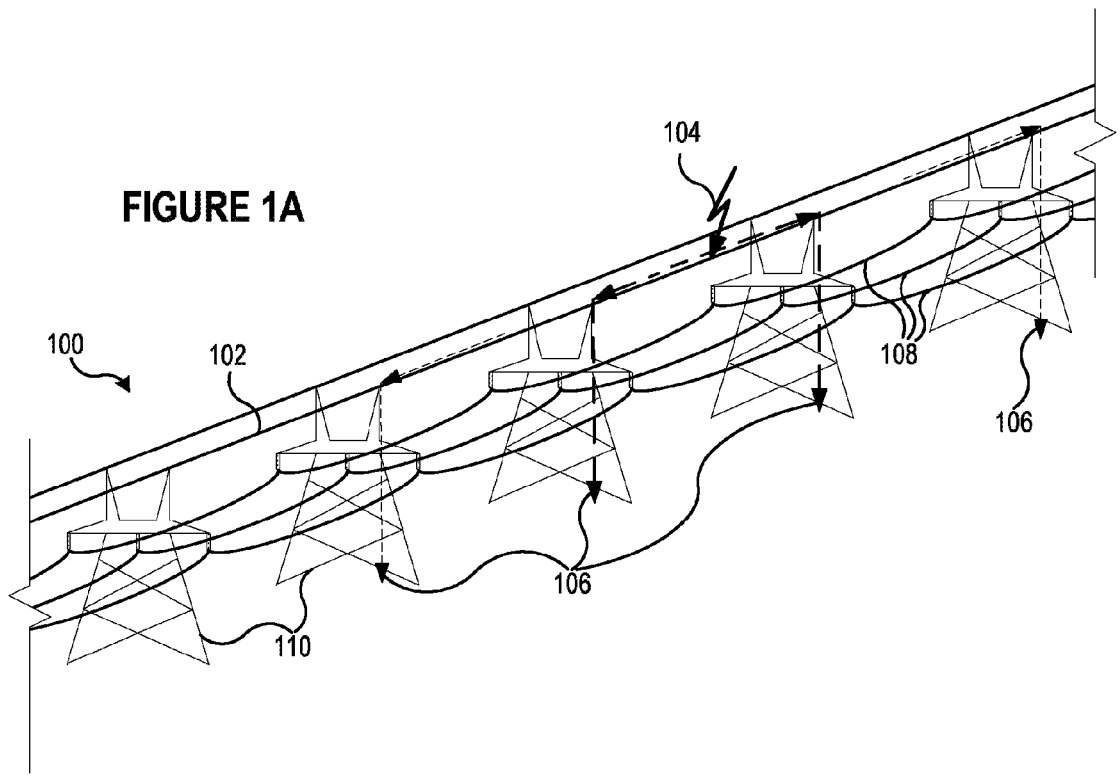
FIG. 1A illustrates a disturbance directed to ground through an OPGW in an electrical transmission system consistent with embodiments of the present disclosure.

Ultra-high speed tripping of line faults brings many benefits including reduced fault damage and equipment wear, improved transient system stability, increased power transfer and asset utilization, safety and reduction of wildfire hazards. Ultra-high speed protection is possible using the traveling wave (TW) technology. TWs in line currents and voltages enable very fast directional decision (sub millisecond) and allow tripping via a communications-based directional comparison scheme. However, these solutions require high fidelity voltage measurements (100 kHz bandwidth). Coupling capacitor voltage transformers (CCVT) that are commonly used for protection in high voltage (HV) and extra high voltage (EHV) networks do not provide this required fidelity. For example, a typical CCVT has a bandwidth of approximately 1 kHz.

Standard current transformers typically have a greater bandwidth and may be used in TW fault detection systems. Fault data information may be exchanged via a high-bandwidth channel (e.g., a 100 Mbps channel). In addition, the measurements may include time stamps that allow for the measurements to be time aligned. Such systems may therefore utilize high bandwidth communications and external time sources.

Single end protection systems (i.e. systems that use measurements from one end of the line only) present several desirable characteristics. For example, the speed of such systems may be enhanced because the system does not need to await the transmission from a remote location. Such systems are independent from delay attributable to a remote relay and transmission delays. Still further, such systems do not require time synchronization; however, single-ended systems may be less robust and require high fidelity voltage sources.

The present disclosure pertains to systems and methods configured to identify TWs in the line currents as well as optical TWs in an optical ground wire ("OPGW") fiber. An OPGW cable combines the functions of grounding and communications. A typical OPGW cable contains a tubular structure of conductive material with one or more optical fibers at the center. The OPGW cable is run between the tops of high-voltage electricity pylons. The conductive part of the cable serves to connect adjacent towers to earth ground, and shields the high-voltage conductors from lightning strikes. The optical fibers within the OPGW cable may be used for high-speed transmission of data.

The systems and methods presented herein may be used to detect disturbances (e.g., lightning strikes, faults, etc.) that create traveling waves, or for diagnostic functions for the OPGW fiber. Although the optical fiber is an insulator, currents in an electrical transmission line couple to the optical fiber. Two mechanisms are primarily responsible for the coupling: the Faraday effect for lightning strikes and faults, and mechanical stress on fiber due to electro-mechanical forces of attraction/repulsion caused by load and fault currents. The current in the OPGW channel affects the state of polarization ("SOP") of the light traveling through the channel. In other words, the coupling shifts the direction of the light as an oscillating wave.

The SOP is a measureable characteristic of light in an OPGW channel. The SOP may be dramatically affected if the coupling current is high and changes quickly. Lightning strikes and faults produce conditions in which the SOP is significantly affected, and such events create a TW in the SOP. This TW travels to the line terminals from the point of distortion at the speed of light in fiber.

In various embodiments, a system consistent with the present disclosure may monitor an OPGW fiber to detect a SOP TW and may monitor an electrical conductor to detect an electrical TW. Such a system may include a number of input current transformers, each in electrical communication with a separate phase of the electric power transmission system for obtaining electrical signals related to currents in each of the phases of the electric power transmission system. Each input CT may be configured to deliver electrical signals to an ADC for sampling and digitizing the electrical signals for use by algorithms for detection of traveling waves on the phase conductors. Such algorithms may use various methods for detecting a rising edge of a TW in the current on the phase conductors.

Traveling waves on the OPGW fiber may be detected using light transmitted through a plurality of polarizing filters. The output of the plurality of polarizing filters may be monitored by a plurality of photo-detectors. In one embodiment, the OPGW is excited using polarized light at one end. As the light travels to the receiving end of the line the state of polarization should either remain the same or change in a uniform manner, such that the light received at the receiving end of the OPGW maintains a particular SOP over time. A disturbance (e.g., an electrical fault or a lightning strike) may cause a change in the SOP on the OPGW that travels from the site of the disturbance in the form of a SOP traveling wave. The SOP traveling wave front may be detected by an increase in the passage of light through one of the plurality of polarizing filters. The light passing through one of the polarizing filters may result in an increase in the electrical signal from the associated photodetector. Thus, an arrival time of traveling wave in SOP on the OPGW may be determined by detecting a change in polarization from one of the polarized filters.

Information relating to the detection of a SOP traveling wave and an electrical traveling wave may be used for ultra-fast (sub millisecond) tripping of line faults. Unlike power lines, OPGW fibers are not interconnected, but are a point-to-point links terminated on the communications equipment transceivers. Accordingly, SOP TWs are contained to a particular segment of a power system corresponding to the affected OPGW channel. As a result, the presence of a SOP traveling wave is a strong indication of a high energy event on/near towers that carry the OPGW fiber. Detection of a SOP traveling wave may therefore be used to supervise other forms of protection to increase both security and speed. For example, following detection of a SOP traveling wave, an overreaching element may be permitted to trip because detection of the TW establishes that the fault occurred within the zone of protection covered by the overreaching element.

A system configured to monitor for SOP TWs and electrical TWs may calculate the location of a disturbance using the difference in propagation velocities for electrical and SOP waves. Both the current and SOP TWs originate at the some point on the line, but may have different velocities due to the different media on which the waves travel. Accordingly, the distance may be determined from the arrival time difference and the velocities:

$$\text{distance} = v_1 v_2 \frac{t_2 - t_1}{v_1 - v_2} \qquad \text{Eq. 1}$$

where:
$v_1$ is the propagation velocity of the electrical TW,
$v_2$ is the propagation velocity of the SOP TW,
$t_1$ is the arrival time of the electrical TW, and
$t_2$ is the arrival time of the SOP TW.

As may be appreciated, all of the information needed to calculate Eq. 1 is available at a single terminal. In other words, the system does not need information from a remote terminal to calculate the distance to the disturbance.

The distance calculated using Eq. 1 may be used to determine if the distance is less than a line length with margin, and if so, the system may trip the breaker based on the arrival time difference between the first current wave and the first SOP wave. Subsequent waves/reflections need not be used to calculate a distance to a fault or for tripping purposes. Reliance on arrival times of the first waves only makes this single end protection principle robust and simple.

Real-time measurement of the SOP may be performed by protective devices in an electrical power system. Detection of TWs in OPGW fiber for line protection is an attractive alternative or enhancement to systems that detect voltage or current traveling waves. Systems monitoring for SOP TWs may avoid the high bandwidth communications channel and external time sources for data alignment associated with TW detection systems that monitor current and voltage.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

FIG. 1A illustrates a disturbance 104 directed to ground through an OPGW 102 in an electrical transmission system 100 consistent with embodiments of the present disclosure. Electrical system 100 includes a plurality of high voltage electrical lines 108 strung between a plurality of pylons 110. OPGW 102 comprises a conductor that may direct the disturbance 104 to ground. In one example, disturbance 104 may comprise a lighting strike. OPGW 102 may shield the plurality of conductors 108 from the lighting strike. The electrical energy from the lighting strike may travel outward, as indicated by arrows 106 to the adjacent pylons where the energy may be dissipated by earth grounding. The weight of the lines 106 indicates that a greater portion of the electrical energy may flow to ground through the two nearest pylons; however, some energy may be transferred to more distant pylons.

Figure 1B:
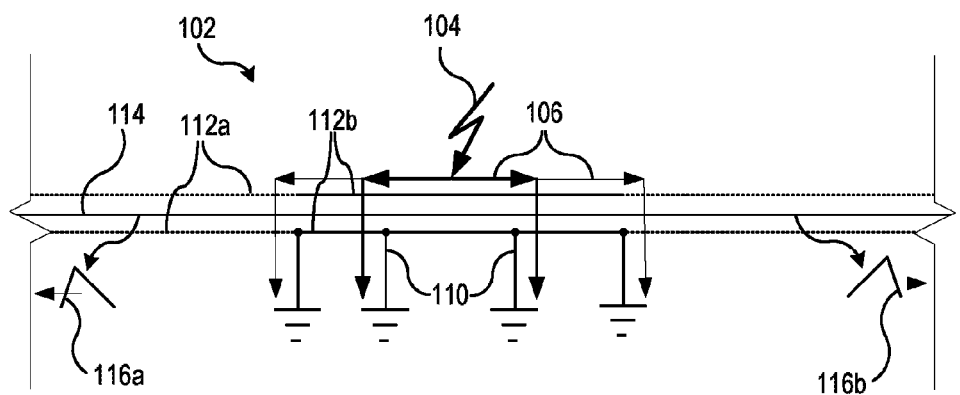
FIG. 1B illustrates the OPGW of FIG. 1A, in which the disturbance affects the state of polarization of an optical signal in the fiber that is detected as a traveling wave at a terminal consistent with embodiments of the present disclosure.

FIG. 1B illustrates the OPGW 102 of FIG. 1A, in which the disturbance 104 affects the state of polarization of an optical signal in an optical fiber 114 that is detected as a traveling wave 116a, 116b at an OPGW terminal consistent with embodiments of the present disclosure. OPGW 102 comprises an outer tubular structure 112 of conductive material with an optical fiber 114 in the center. The electrical energy from disturbance 104 travels outward, as indicated by arrows 106, to the adjacent pylons. An electrically energized portion 112b of the outer tubular structure is designated by a solid line. The electrical energy from disturbance 104 is dissipated by earth grounding 110, which represents the pylons 110 in FIG. 1A. The remaining portion 112a of the outer conductor is not electrically energized, as designed by a dashed line.

Disturbance 104 affects the SOP of a signal traveling on optical fiber 114 due to the Faraday effect and owing to the helical structure of the conductor wires, and launches traveling waves 116a, 116b emanating from the point of the disturbance 104. Detectors at terminals may detect the traveling waves 116a, 116b at opposite ends of the optical fiber 114. The time of arrival of the traveling waves 116a, 116b may be noted and used to determine the location of the disturbance 104.

Figure 2:
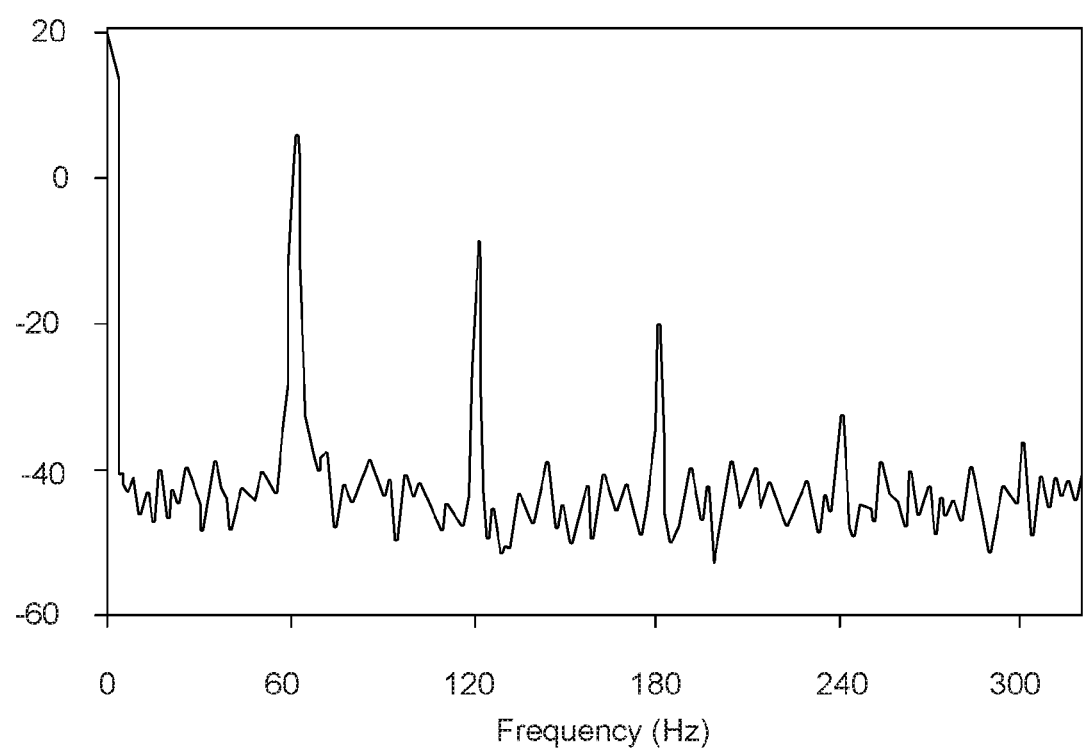
FIG. 2 illustrates a plot of a fast Fourier transform of a state of polarization for line load conditions consistent with embodiments of the present disclosure.

FIG. 2 illustrates a plot of a fast Fourier transform ("FFT") of a SOP of a signal carried on an OPGW for line load conditions in a 60 Hz electrical system consistent with embodiments of the present disclosure. The FFT clearly shows a spike at the fundamental frequency of the system (i.e., 60 Hz), together with several harmonics. The presence of the electrical system's fundamental frequency and harmonics shows the coupling between the OPGW channel and the current in the transmission line's power conductors.

Figure 3A:
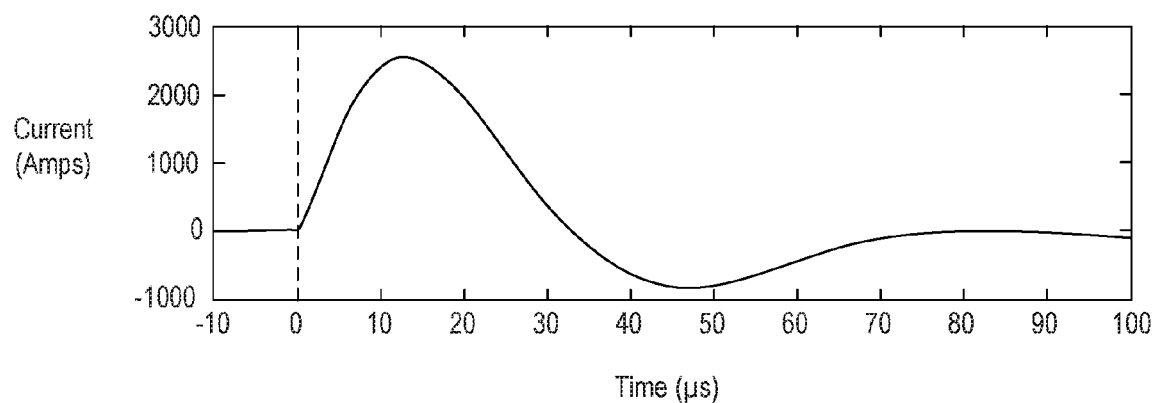
FIG. 3A illustrates a plot over time of a current in an electrical conductor created by a disturbance, as seen from the point of disturbance occurring away from one terminal of an electrical conductor consistent with embodiments of the present disclosure.

FIG. 3A illustrates a plot over time of a current in an electrical conductor created by a disturbance, as seen from the point of disturbance occurring away from one terminal of the electrical conductor consistent with embodiments of the present disclosure. In the illustrated embodiment, the disturbance is a lighting strike. The time axis has been aligned so that the current ramp occurs at time t=0.

Figure 3B:
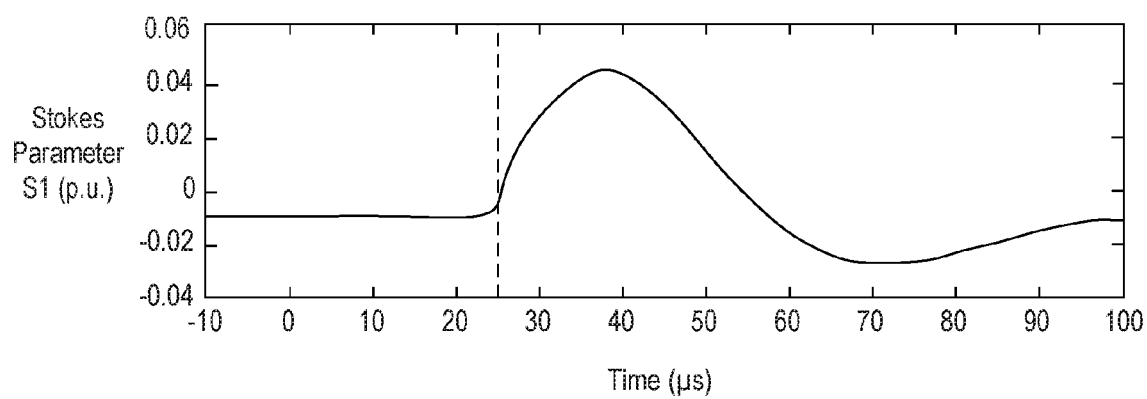
FIG. 3B illustrates a plot over time of a Stokes Parameter as seen at one terminal indicating a change in the SOP of an optical signal transmitted through an OPGW fiber and created by the current surge illustrated in FIG. 3A consistent with embodiments of the present disclosure.

FIG. 3B illustrates a plot over time of the Stokes Parameter 51 as seen at one terminal and shows a change created by the current created by the lighting strike in the SOP of an optical signal carried by an OPGW associated with the electrical conductor consistent with embodiments of the present disclosure. In comparison to FIG. 3A, the SOP TW is delayed by 25 µs. The delay between the current measured at the origin of the disturbance and shown in FIG. 3A and the SOP TW measured at one terminal shown in FIG. 3B may be used to determine the distance to the disturbance. In one embodiment, the propagation velocity of the SOP TW is nearly $2 \times 10^8$ meters/sec. This value, together with a delay of 25 µs indicate that the disturbance occurred 5 km from the terminal. In various embodiments an IED or other device may monitor an electrical conductor and an OPGW fiber to determine a delay between a current TW and an SOP TW. The device may then determine the distance to the fault based on the delay and the propagation velocities of the current TW and the SOP TW.

Figure 4:
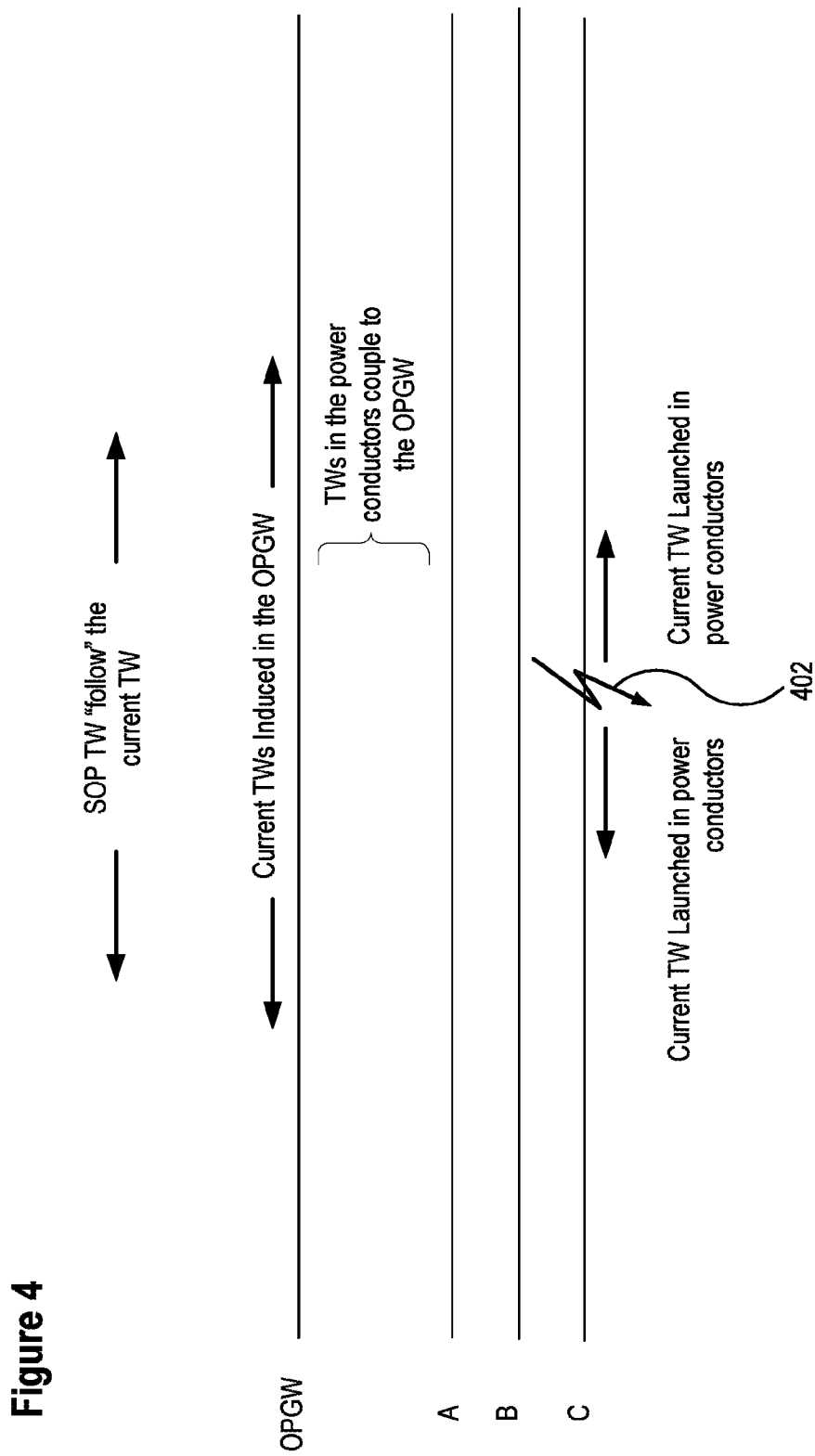
FIG. 4 illustrates TW paths for both a SOP on an OPGW fiber and for current on phase conductors of a transmission system created by a disturbance on one of the conductors consistent with embodiments of the present disclosure.

FIG. 4 illustrates TW paths for both a SOP on an OPGW fiber and for current on phase conductors of a transmission system created by a disturbance on one of the power conductors consistent with embodiments of the present disclosure. A disturbance 402 occurs on a conductor associated with phase C of an electric power system. The disturbance 402 may comprise a fault. The disturbance 402 launches current TWs in both directions from the location of the disturbance. The traveling waves in the power conductors couple to the OPGW to create a current in the OPGW. This current is dissipated by earth grounding at pylons. The current in the OPGW in turn launches a TW in the SOP of the OPGW fiber.

Detectors disposed at either end of the conductors or the OPGW may observe the current TW and the SOP TW created by the disturbance 402. Such detectors may use the current TW and the SOP TW to determine the location of the disturbance 402. Further, the detectors may be configured to take protective action based on the detection of the TWs. For example, the detector may be configured to issue a trip command based on the detection of both the TWs. As noted above, detection of a SOP TW may establish that the disturbance 402 occurred within a zone of protection of a protective device.

Figure 5:
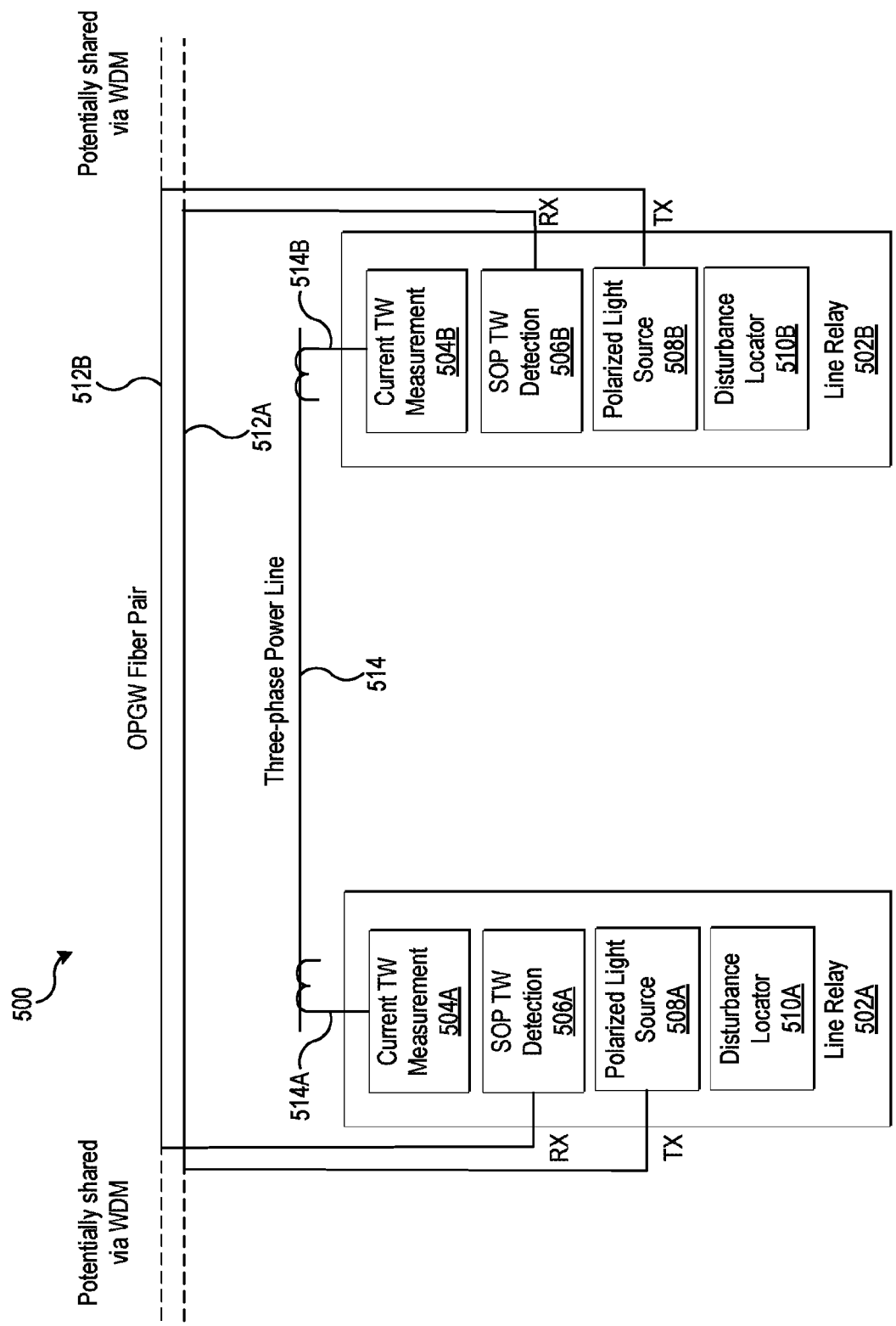
FIG. 5 illustrates a simplified block diagram of one embodiment of a system for detecting traveling waves in a transmission system consistent with embodiments of the present disclosure.

FIG. 5 illustrates a simplified block diagram of one embodiment of a system 500 for detecting traveling waves in a transmission system consistent with embodiments of the present disclosure. System 500 includes line relays 502A, 502B disposed at opposite ends of a three-phase power line 514. Line relays 502A, 502B may include a current transformer 514A, 514B, respectively, that provides an input to a current TW measurement subsystem 504A, 504B. Current TW measurement subsystems 504A, 504B may be configured to detect and analyze current TWs on three-phase power line 514.

Line relays 502A, 502B may be in communication using an OPGW fiber pair 512. Line relay 502A may transmit information via OPGW fiber 512A and may receive information via fiber 512B. Line relay 502B may transmit information via OPGW fiber 512B and may receive information via fiber 512A. In various embodiments, OPGW fiber may be shared via wavelength division multiplexing (WDM). In such embodiments, systems and methods consistent with the present disclosure may utilize a fiber pair that is already in use by multiplexing a new wavelength on the channel. Line relays 502A, 502B may include polarized light sources 508A, 508B that may be used to transmit an optical signal. In various embodiments, the optical signal may comprise an optically encoded data stream or may comprise a continuous light source. The received optical signal may be provided to a SOP TW detection system, 506A, 506B. The SOP TW detection subsystem 506A, 506B may be configured to detect and analyze SOP TWs on OPGW fiber pair 512.

Disturbance locators 510A, 5106 may be configured to analyze information from current TW Measurement subsystem 504A, 504B and SOP TW detection subsystem 506A, 506B, respectively, to determine a distance to a disturbance. As discussed above, a disturbance may launch current TWs and SOP TWs toward line relays 502A, 502B. The different propagation velocities associated with the current TW and the SOP TW may be determine and may be used to detect the distance to the disturbance using Eq. 1. In various embodiments, line relays 502A, 502B may be configured to take a protective action based upon one or more of the detection of a current TW, a SOP TW, and the distance to the disturbance.

Figure 6:
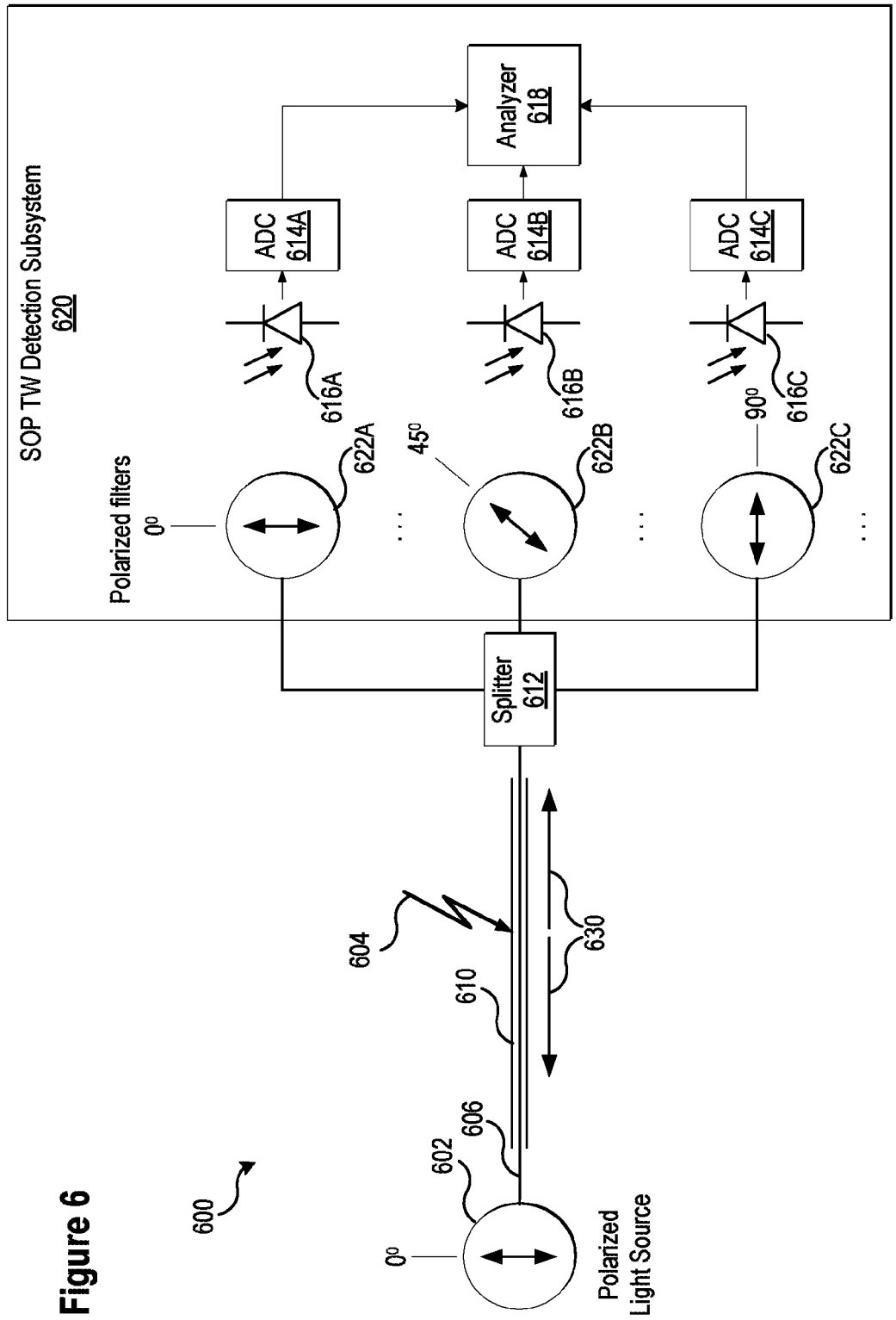
FIG. 6 illustrates a simplified block diagram of one embodiment of a system for detecting SOP traveling waves in an OPGW consistent with embodiments of the present disclosure.

FIG. 6 illustrates a simplified block diagram of one embodiment of a system 600 for detecting a SOP traveling wave in an OPGW consistent with embodiments of the present disclosure. In the illustrated embodiment, a polarized light source 602 is configured to send an optical signal through a fiber optic cable 606 disposed within an OPGW cable 610. In the illustrated embodiment, the polarized light source is embodied as a 0° polarized light source. In other embodiments consistent with the present disclosure, a light source may be elliptically polarized or partially polarized. Still further, the light source may be configured to generate an encoded data stream or may generate a continuous light source. A disturbance 604 may generate a current impulse that travels outward from the point of the disturbance through OPGW cable 610 as indicated by arrow 630. The current may be caused directly by an event that impacts the OPGW, such as a lightning bolt striking the OPGW cable 610. Alternatively, the current in OPGW cable 610 may be induced as a result of a change in current flowing through associated electrical conductors (not shown), such as an electrical fault.

The current impulse 630 may create a SOP TW in fiber optic cable 606 that may be detected by a SOP TW detection subsystem 620. A splitter 612 may create input optical signals that may be inputs to plurality of polarized filters. Each filter may be configured to pass light at intervals spaced from each other. In the illustrated embodiment, SOP TW detection subsystem includes a 0° polarized filter 622A, a 45° polarized filter 622B, and a 90° polarized filter 622C. Other embodiments may include more or fewer polarized filters. For example, if three filters are used, one filter may be positioned at 0°, another offset from the first by 45°, and the third offset from the first by 90°. More or fewer separate polarized filters may be used to pass light from the OPGW to more particularly refine and detect the state of polarization of light from the OPGW. Other embodiments may use more filters each configured to pass light at a different polarization. Still other embodiments may use fewer filters. The appropriate number of filters may be equally spaced.

The plurality of polarized filters 622A, 622B, 622C, may be associated with a corresponding plurality of photo detectors 616A, 616B, 616C, and a corresponding plurality of analog-to-digital ("ADC") converters. The outputs of the photodetectors may be sampled at the high rate. The plurality of photo detectors 616A, 616B, 616C, are configured to emit an electrical signal proportional to the amount of light passed thereto from the polarized filters 622A, 622B, 622C in optical communication therewith. In one specific embodiment, the photo detectors may have a high bandwidth detector having a microsecond response time. In one specific embodiment, the plurality of ADCs 614A, 614 B, 614C, have a sampling rate of 1.5 Msps. The digitized samples may be used to detect changes in the SOP of the light from the OPGW in order to detect a traveling wave in the SOP from the OPGW.

The digitized representations of the photo detectors 616A, 616B, 616C may be provided to analyzer 618, which may be configured to detect a SOP TW. A change in the polarization of the optical signal traveling through the fiber optic cable 606 may be detected by photo detectors 616B or 616C. Such a change may be assessed by analyzer 618, which may determine whether the change is consistent with a SOP TW. SOP TW detection subsystem 620 may be used as part of a system that allows for high speed tripping utilizing current and SOP TWs.

Various embodiments consistent with the present disclosure may use partially-polarized light to excite the OPGW. In such embodiments, the relative SOP would not be expected to change dramatically during normal operation. Rather, each of the polarized filters may pass a portion of light, and each of the photodetectors may pass an electric signal to the ADCs. A baseline of such detected light may be established. Once a disturbance occurs, a traveling wave in the SOP on the OPGW would change the SOP such that one or more of the polarized filters transmits an increased amount of light, and thus, the associated photo detector may exhibit an increase in its output. In some circumstances, an increase in the light passing through one of the plurality of filters may be accompanied by a decrease in the light passing through another of the polarized filters to its associated photodetector. By comparing incoming information to the baseline established during normal operation and noting changes, a time of arrival of the traveling wave may be detected by a change in light passed by one or more of the polarized filters.

Figure 7:
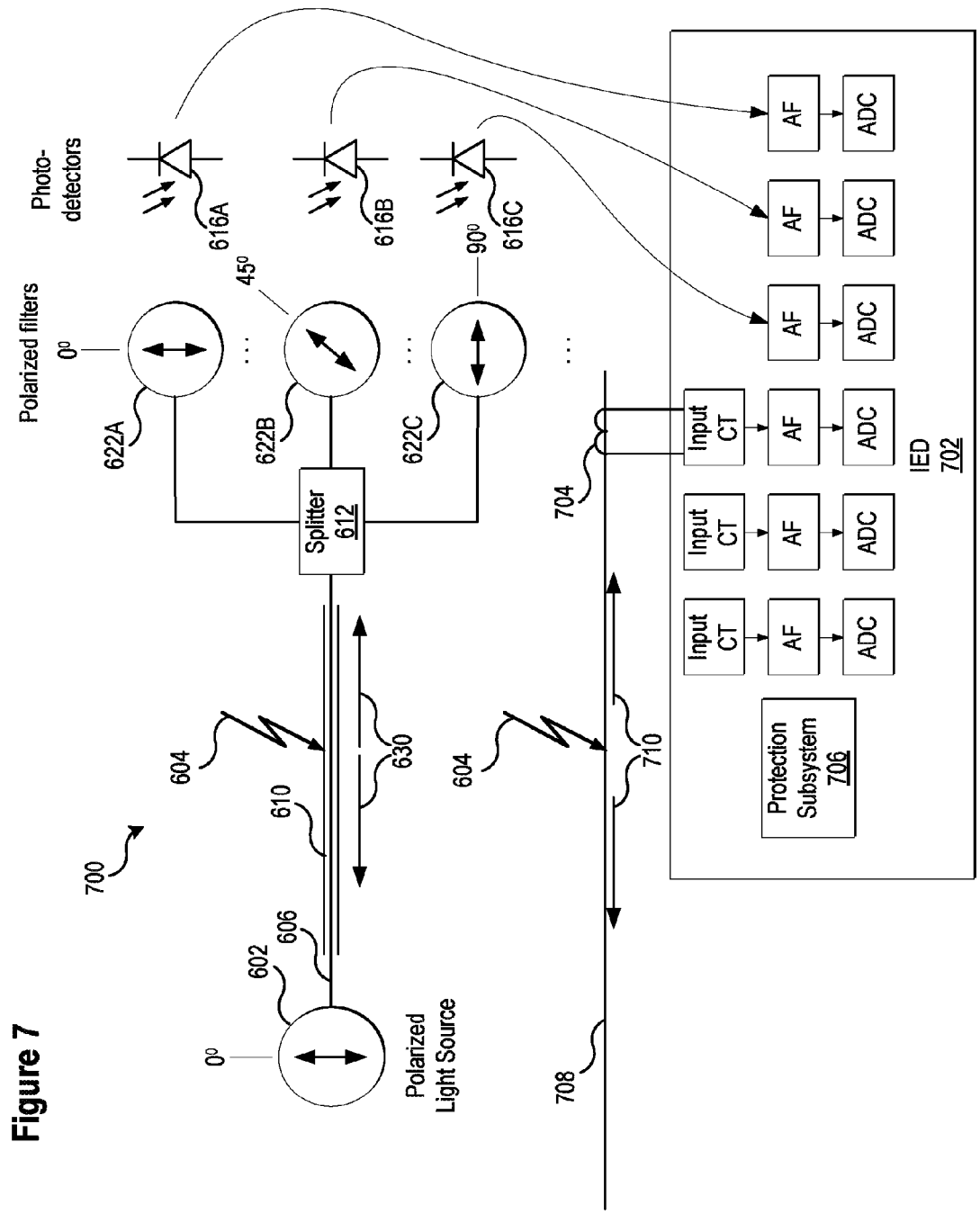
FIG. 7 illustrates a simplified block diagram of one embodiment of a system for detecting SOP traveling waves in an OPGW and current traveling waves in an electrical conductor consistent with embodiments of the present disclosure.

FIG. 7 illustrates a simplified block diagram of one embodiment of a system 700 configured to detect SOP traveling waves and current traveling waves in an electrical conductor 708 consistent with embodiments of the present disclosure. System 700 may share various components with system 600. Such components are identified using the same reference numbers.

An IED 702 may be configured to acquire and record data from various inputs. The data acquired by IED 702 may be available locally or via remote access. While IED 702 may not require external communication to determine the location of a disturbance, remote access to IED 702 may be implemented to facilitate data gathering and operation. In various embodiments, IED 702 may be embodied by the SEL-411L Protection, Automation, and Control System available from Schweitzer Engineering Laboratories of Pullman, Wash. The SEL-411L includes 1.5 Msps ADC channels, which may be used to sample the outputs from the polarizing filters 622A, 622B, and 622C. In one specific embodiment, a 5 ms recording at a 1 MHz rate may be associated with the photodetectors and current channels.

A plurality of aliasing filters (AF) may also be associated with the outputs of the photodetectors 616A, 616B, 616C. A current transformer 704 may detect a current traveling wave 710 on electrical conductor 708. To the extent that additional inputs are needed to measure the SOP waves, multiple SEL-411L devices may be used. For example, one SEL-411L device may be used to detect and measure SOP TWs and the other SEL-411L device may be used to detect and measure current TWs. In another scenario a single SEL-411L may be used.

In various embodiments, polarization detection does not necessarily require that the polarizer does not require high accuracy or long-term stability. The relatively low accuracy requirements may enable a relatively low cost of production. IED 702 may be used to measure the SOP with a high bandwidth. In certain embodiments, rapid changes in the SOP may be detected, but not the SOP value itself. In one specific embodiment, the SOP measurement may be configured to detect rise times in polarization as fast as 2 μs.

IED 702 may provide high speed data acquisition (e.g., on the order of 1 MHz or greater). Further, IED 702 may provide use of the filters' outputs as low voltage signals (e.g., on the order of millivolts). Thus, IED 702 may be used to monitor and detect both electrical and optical TWs into the same data acquisition environment.

The detection of either SOP TWs or electrical TWs may be used to trigger a protective action in system 700. In one embodiment, a protection subsystem 706 may be configured to implement a protective action upon detection of a sudden change in the SOP. In some embodiments, the protective action may be implemented upon the detection of both a SOP TW and an electrical TW.

Upon high-current fast discharge to the OPGW, such as a fault or lightning strike, IED 702 may be configured to detect changes in the SOP. In other embodiments, the OPGW fiber may be excited with partially-polarized light. Upon high-current fast discharge to the OPGW, such as a fault or lightning strike, the 411L may be configured to detect changes in the SOP.

Figure 8:
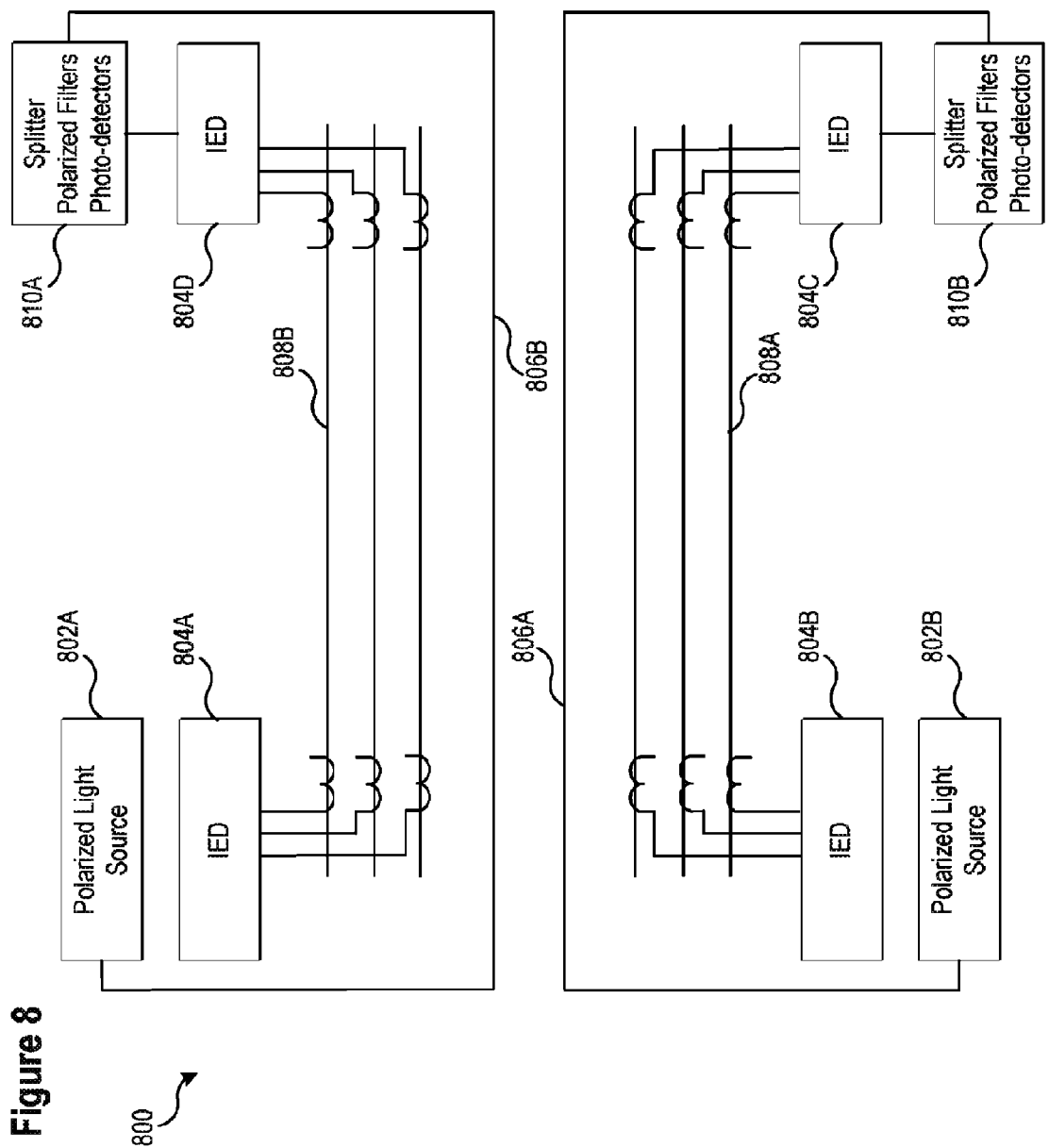
FIG. 8 illustrates a simplified block diagram of one embodiment of a system for detecting traveling waves in a transmission system consistent with embodiments of the present disclosure.

FIG. 8 illustrates a simplified block diagram of one embodiment of a system 800 for detecting traveling waves in an electrical transmission system consistent with embodiments of the present disclosure. The illustrated embodiment utilizes a plurality of IEDs 804A-D disposed on opposite ends of each of transmission lines 806A, 806B. In various embodiments, the IEDs 804A-D may be embodied as SEL-411L devices. In the illustrated embodiment, the processing devices may sample output from polarized filters together with the currents. Optical signals may be generated by the polarized light sources 802A, 802B and may be transmitted through OPGWs 806A, 806B. A splitter, a plurality of polarized filters, and photo detectors 810A, 810B may provide information to IEDs 804D, 804C, respectively.

The arrival time of TWs in SOP on the OPGW and the arrival time of TWs on a phase conductor may be used in the various monitoring and protection functions performed by IEDs 804A-804D. In one embodiment, the IEDs 804A-804D may calculate a distance to the fault using the arrival times of the traveling wave on the OPGW and the traveling wave on the phase conductor using, for example, Equation 1. In another embodiment, the arrival of a traveling wave on the OPGW may be used to verify a determination that the fault is within a particular zone of protection associated with the particular IEDs 804A-804D. In another embodiment, the arrival of a traveling wave on the OPGW may be used to override a distance blocking function of the IEDs 804A-804D to take a protective action in a case where the calculated distance to the fault is outside of the zone of protection of the particular IED.

In various embodiments, the splitter, polarized filters, and/or photo detectors 810A, 810B may be integrated into an associated IED (e.g., IEDs 804D, 804C, respectively). Incorporating the optical components into a single housing may permit a system consistent with the present disclosure to be relatively compact, and/or configured to be easily integrated into existing electrical systems. For example, in one embodiment, the various components may be housed in a unit configured for mounting in a 19" rack, which are typically used in electrical power system substations. In other embodiments, one or more of the splitter, polarized filters, and photo detectors may be housed within a separate unit. Still further, the connections associated with the various inputs used by a system consistent with the present disclosure may be implemented using standard connectors for ease of assembly and commissioning.

FIG. 9 illustrates a flow chart of a method 900 for detecting a disturbance in an electrical power system based on the detection of a SOP traveling wave and implementing a protective action consistent with embodiments of the present disclosure. At 902, an optical signal carried on an OPGW fiber may be received. In various embodiments, the optical signal may comprise polarized light, while in other embodiments, the optical signal may comprise partially polarized light.

At 904, the optical signal may be passed through a plurality of polarized filters. A splitter may be used to direct the optical signal to the plurality of polarized filters. In some embodiments, an appropriate number of filters may be polarized by even multiples of a specific angle of polarization (e.g., each filter may be an integer multiple of 45°). The number of filters may vary in different embodiments consistent with the present disclosure.

At 906, transmission of optical radiation passed through the plurality of polarized filters may be detected. In various embodiments, a photo detector may be associated with each filter. Optical radiation passed through the filter may be received by the photo detector and translated into an electrical signal. At 908, the electrical signal created by the photo detector and corresponding to the passage of optical radiation. A plurality of ADCs may be used to create the digitized signals.

At 910, method 900 may determine whether a change is detected in the digitized representation of the optical radiation passed through the plurality of polarized filters. A change may be detected based on various criteria, including an increase in the amount of optical radiation passing through one or more of the polarized filters, a decrease in the amount of optical radiation passing through one or more of the polarized filters, a change from an established baseline, etc. If no change is detected, method 900 may return to 902.

At 912, system 900 may determine whether a detected change is indicative of a SOP TW. Certain criteria may be established for identifying SOP TWs that may be assessed to different between changes resulting from a SOP TW and changes resulting from other phenomena. Such criteria may include, the duration of the change, the intensity or quantity of the change, departure from an establish profile, etc. If the change is not indicative of a SOP TW, method 900 may return to 902.

At 914, method 900 may implement a protective action based upon the detection of the SOP TW. Various types of protective actions may be implemented. For example, a trip command may be issued to the line circuit breakers. Alternatively, other protective actions may be implemented to address the disruption that caused the SOP TW.

FIG. 10 illustrates a flow chart of a method 1000 for detecting a disturbance in an electrical power system based on the detection of a SOP traveling wave and an electrical TW, determining the distance to the disturbance, and selectively implementing a protective action if the disturbance is within a zone of protection consistent with embodiments of the present disclosure. At 1002, an OPGW fiber may be monitored for a SOP TW and an electrical conductor may be monitored for an electrical TW. At 1004, method 1000 may determine whether an electrical TW has been detected. If an electrical TW has not been detected, method 1000 may return to 1002. If an electrical TW has been detected, the time of arrival of the electrical TW may be determined at 1006.

At 1008, method 1000 may determine whether a SOP TW has been detected. If a SOP TW has not been detected, method 1000 may return to 1002. In a system implementing method 1000, the system may simultaneously monitor for SOP TWs and electrical TWs, or alternatively, the order of elements 1004 and 1008 may be switched. In any event, method 1000 may determine when both a SOP TW and an electrical TW have occurred. At 1010, the time of arrival of the SOP TW may be determined.

At 1012, method 1000 may determine a distance to a disturbance that caused the detected SOP TW and the detected electrical TW. In various embodiments, the distance to the disturbance may be determined based on the difference in the time of arrival of the detected SOP TW and the detected electrical TW, and the different propagation velocities of the electrical TW and the SOP TW. In one specific embodiment, Eq. 1 may be used to determine the distance to the disturbance.

At 1014, method 1000 may determine whether the disturbance is within a zone of protection. In some embodiments, the zone of protection may be co-extensive with the length of the OPGW fiber. As such, detection of the SOP TW may indicate that the disturbance is within the zone of protection. In other embodiments, a system implementing method 1000 may compare the determined distance to the disturbance to an overreach setting. If the disturbance is within the zone of protection, method 1000 may implement a protective action at 1016. Various types of protective actions may be implemented. For example, a trip command may be issued to the line's circuit breakers. Alternatively, other protective actions may be implemented to address the disruption that caused the SOP TW and the electrical TW. If the disturbance is determined to be outside of the zone of protection at 1014, method 1000 may return to 1002.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A system configured to monitor an optical ground wire (OPGW) fiber associated with an electric power line, comprising:
    a state of polarization (SOP) detection subsystem to detect a change in at least one polarization parameter of optical radiation carried by the OPGW fiber and caused by a disturbance on the electric power line;
    a digitization subsystem configured to create a first digitized representation of the at least one polarization parameter; and
    an intelligent electronic device (IED) in communication with the SOP detection system, comprising:
        a first input configured to receive the first digitized representation of the at least one polarization parameter;
        a second input configured to receive a second digitized representation of an electrical signal associated with the electric power line;
        a SOP traveling wave (TW) subsystem configured to identify a SOP TW based on a change in the SOP indicated by the first digitized representation, and
        an electrical traveling wave module configured to identify an electrical TW based on the second digitized representation; and
        a protection subsystem in communication with the SOP module and the traveling wave module configured to implement a protective action in response to identification of the SOP TW and the electrical TW.

2. The system of claim 1, wherein the IED further comprises:
    a disturbance locator configured to determine a distance to the disturbance based on: an SOP TW arrival time, an electrical TW arrival time, a propagation velocity of the SOP TW, and a propagation velocity of the electrical TW.

3. The system of claim 2, wherein the protection subsystem is further configured to determine that the disturbance is within a zone of protection of the IED based on the distance to the disturbance.

4. The system of claim 2, wherein the IED further comprises:
    a time input configured to receive a time signal;
    wherein the SOP TW arrival time and the electrical TW arrival time are determined with reference to the time signal.

5. The system of claim 2, wherein the disturbance locater is configured to determine the distance using only measurements from one terminal of the OPGW fiber and only one terminal of the electric power line.

6. The system of claim 1, wherein the SOP detection subsystem comprises:
    a splitter to divide the optical radiation into a plurality of paths;
    a plurality of polarized filters in optical communication with the splitter, each configured to transmit a polarized portion of the electro-optical radiation; and,
    a plurality of photodetectors, each in optical communication with one of the plurality of polarized filters, each configured to emit an electrical signal in response to optical radiation transmitted by the polarized filter in optical communication therewith;

wherein the digitization subsystem is configured to receive electrical signals from the plurality of photodetectors.

7. The system of claim 6, wherein each of the plurality of polarized filters is configured to pass a different polarity of the optical radiation.

8. The system of claim 1, further comprising a housing configured to contain the SOP detection subsystem, the digitization subsystem, and the IED.

9. The system of claim 1, wherein the disturbance comprises one of a lightning strike and an electrical fault.

10. The system of claim 1, wherein the optical radiation comprises one of linearly polarized light, elliptically polarized light, and partially polarized light.

11. The system of claim 1, wherein the optical radiation comprises one of an optically encoded data stream and a continuous light source.

12. A method for detecting a disturbance in an electrical power system and implementing a protective action, the method comprising:
receiving optical radiation carried by an optical ground wire (OPGW) fiber associated with an electric power line in the electric power system;
passing the optical radiation through a plurality of polarized filters;
detecting transmission of the optical radiation through the plurality of polarized filters;
creating a first digitized representation of the optical radiation transmitted through the plurality of polarized filters;
detecting a change in the digitized representation of the optical radiation;
identifying a state of polarization (SOP) traveling wave (TW) based on the change in the digitized representation of the optical radiation;
receiving a second digitized representation of an electrical signal associated with the electric power line;
identifying an electrical TW based on the second digitized representation; implementing a protective action based on the identification of the SOP TW and the electrical TW.

13. The method of claim 12, further comprising:
determining a distance to the disturbance based on: a SOP TW arrival time, an electrical TW arrival time, a propagation velocity of the SOP TW, and a propagation velocity of the electrical TW.

14. The method of claim 13, further comprising:
determining that the disturbance is within a zone of protection based on the distance to the disturbance.

15. The method of claim 13, further comprising:
receiving an input time signal; and
determining the SOP TW arrival time and the electrical TW arrival time with reference to the time signal.

16. The method of claim 13, wherein the distance to the disturbance is determined using measurements from only one terminal of the OPGW fiber and only one terminal of the electric power line.

17. The method of claim 12, further comprising:
splitting the optical radiation carried by an OPGW fiber into a plurality of paths;
directing each of the plurality of paths to one of the plurality of polarized filters;
wherein detecting transmission of the optical radiation through the plurality of polarized filters comprises placing a photodetector in optical communication with each of the plurality of polarized filters; and
wherein creating the first digitized representation of the optical radiation transmitted through the plurality of polarized filters comprises digitizing an output of each photodetector.

18. The method of claim 12, wherein each of the plurality of polarized filters is configured to pass a different polarity of the optical radiation.

19. The method of claim 12, wherein the optical radiation comprises one of linearly polarized light, elliptically polarized light, and partially polarized light.

20. The method of claim 12, wherein the optical radiation comprises one of an optically encoded data stream and a continuous light source.

* * * * *